(12) United States Patent
Chung

(10) Patent No.: US 11,385,259 B2
(45) Date of Patent: *Jul. 12, 2022

(54) PROBE MEMBER FOR POGO PIN, METHOD OF MANUFACTURING THE PROBE MEMBER, POGO PIN COMPRISING THE PROBE MEMBER

(71) Applicant: ISC CO., LTD., Seongnam-si (KR)

(72) Inventor: Young Bae Chung, Seongnam-si (KR)

(73) Assignee: ISC CO., LTD., Seongnam-si (KR)

(*) Notice: Subject to any disclaimer, the term of this patent is extended or adjusted under 35 U.S.C. 154(b) by 156 days.

This patent is subject to a terminal disclaimer.

(21) Appl. No.: 16/627,209

(22) PCT Filed: Jun. 22, 2018

(86) PCT No.: PCT/KR2018/007089
§ 371 (c)(1),
(2) Date: Dec. 27, 2019

(87) PCT Pub. No.: WO2019/004663
PCT Pub. Date: Jan. 3, 2019

(65) Prior Publication Data
US 2020/0124637 A1    Apr. 23, 2020

(30) Foreign Application Priority Data
Jun. 28, 2017 (KR) ...................... 10-2017-0081746

(51) Int. Cl.
*G01R 1/067* (2006.01)
*G01R 3/00* (2006.01)

(52) U.S. Cl.
CPC ..... *G01R 1/06722* (2013.01); *G01R 1/06755* (2013.01); *G01R 3/00* (2013.01)

(58) Field of Classification Search
CPC .. G01R 1/06722; G01R 1/06755; G01R 3/00; G01R 1/06738; G01R 1/06761
See application file for complete search history.

(56) References Cited

U.S. PATENT DOCUMENTS

| 7,586,321 B2 | 9/2009 | Hirakawa et al. |
| 9,128,120 B2 | 9/2015 | Lee |

(Continued)

FOREIGN PATENT DOCUMENTS

| CN | 102971842 A | 3/2013 |
| JP | 2008-82718 A | 4/2008 |

(Continued)

OTHER PUBLICATIONS

KIPO; Application No. PCT/KR2018/007089; International Search Report dated Sep. 7, 2018.

(Continued)

*Primary Examiner* — Lee E Rodak
(74) *Attorney, Agent, or Firm* — Fitch, Even, Tabin & Flannery LLP

(57) ABSTRACT

A probe member for a pogo pin, a method of manufacturing the probe member, and a pogo pin including the probe member are disclosed. The probe member for the pogo pin has a contact portion including a material having hardness greater than the hardness of a first body portion and a second body portion, and each of the first and second body portions includes a material having electrical conductivity equal to or greater than 50% IACS (International Annealed Copper Standard).

11 Claims, 14 Drawing Sheets

(56) References Cited

U.S. PATENT DOCUMENTS

| | | | |
|---|---|---|---|
| 9,547,023 B2 | 1/2017 | Lee | |
| 9,726,693 B2 | 8/2017 | Lee | |
| 2004/0239355 A1* | 12/2004 | Kazama | G01R 1/06722 324/755.05 |
| 2008/0061809 A1 | 3/2008 | Lee et al. | |
| 2008/0074128 A1 | 3/2008 | Hirakawa et al. | |
| 2013/0099811 A1 | 4/2013 | Lee | |
| 2013/0106457 A1* | 5/2013 | Lee | G01R 1/06738 324/755.11 |

FOREIGN PATENT DOCUMENTS

| | | | |
|---|---|---|---|
| JP | 2009198238 A * | 9/2009 | |
| JP | 2013-529789 A | 7/2013 | |
| KR | 10-2008-0023028 A | 3/2008 | |
| KR | 10-2011-0002962 A | 1/2011 | |
| KR | 10-1047550 B1 | 7/2011 | |
| KR | 10-2013-0124824 A | 11/2013 | |
| KR | 10-1439342 B1 | 9/2014 | |
| TW | 200815763 A | 4/2008 | |
| TW | 201229518 A1 | 7/2012 | |
| TW | I421504 B | 1/2014 | |

OTHER PUBLICATIONS

TIPO; Application No. 10820659310; Office Action dated Jul. 15, 2019.
CNIPA; Application No. 201880043838.5; Office Action dated Jun. 3, 2021.

* cited by examiner

PROBE MEMBER FOR POGO PIN, METHOD OF MANUFACTURING THE PROBE MEMBER, POGO PIN COMPRISING THE PROBE MEMBER

CROSS-REFERENCE TO RELATED APPLICATIONS

This application is a U.S. national phase application filed under 35 U.S.C. § 371 of International Application No. PCT/KR2018/007089, filed Jun. 22, 2018, designating the United States, which claims priority from Korean Application Number 10-2017-0081746, filed Jun. 28, 2017.

FIELD OF THE INVENTION

The present disclosure relates to a probe member for a pogo pin, a method of manufacturing the probe member, and a pogo pin including the probe member, and more particularly, to a probe member having improved conductivity and wear resistance for a pogo pin, and a method of manufacturing the probe member, and a pogo pin including the probe member.

BACKGROUND OF THE INVENTION

After semiconductor devices are manufactured, the semiconductor devices are electrically inspected to check whether they are reliable and operate normally. During these inspection processes, test devices including pads and test sockets are used. The test sockets are used to connect terminals of the semiconductor devices to the pads of the test devices such that electrical signals may be exchanged between the terminals of the semiconductor devices and the test devices.

To this end, pogo pins are arranged in the test sockets as contact means. The pogo pins include probe members and elastic members to guarantee a smooth contact between the semiconductor device and the test device and absorb mechanical shocks that may occur when the semiconductor devices and the test devices are brought into contact.

FIG. 1 is a view schematically illustrating a pogo pin of the related art. As shown in FIG. 1, an upper plunger 1005 and a lower plunger 1006 protrude from both ends of a body 1004 of the pogo pin, and a spring 7 is inserted in the body 1004. The upper and lower plungers 1005 and 1006 are biased by the spring 1007 in directions away from each other. In this state, the upper plunger 1005 is brought into contact with a terminal 2002 of a semiconductor device 1001, and the lower plunger 1006 is brought into contact with a pad 1009 of a test device 1008 such that the terminal 1002 of the semiconductor device 1001 may be electrically connected to the pad 1009 of the test device 1008.

Another pogo pin of the related art is disclosed in Korean Patent No. 10-1439342. Specifically, referring to FIGS. 2 and 3 of this patent, the pogo pin includes a probe member 1110, a body 1120, an elastic member 1130 placed in the body 1120 to bias the probe member 1110 in an upward direction, and a lower probe member 1140 at least partially exposed through a lower opening of the body 1120 and supported by the elastic member 1130, wherein the probe member 1110 includes a plurality of probe plates 1112 to 1116 integrally attached to each other and including probe portions 1112a to 1114a and coupling portions 1112b to 1114b.

The pogo pins of the related art have the following problems.

Since probe portions to be directly brought into contact with a terminal of a semiconductor device have a plate shape, the contact area between the terminal of the semiconductor device and the probe portions is limited. In addition, although the probe portions are required to have high wear resistance to endure a concentrated load applied by the semiconductor device and coupling portions are required to have high conductivity to compensate for current loss at the coupling portions, since the probe portions of the related art are horizontally stacked with respect to a contact portion, the probe portions and the coupling portions have limited electrical and mechanical properties even when formed of different materials. That is, the pogo pins have poor wear resistance and conductivity.

SUMMARY OF THE INVENTION

A technical solution of the present disclosure is to provide a probe member for a pogo pin in which a contact portion and body portions of the probe member are stacked in a vertical direction based on a contact region with a terminal, the contact portion includes a material having high hardness, and the body portions include a material having high conductivity to improve the wear resistance and conductivity of the probe member; a method of manufacturing the probe member; and a pogo pin including the probe member.

However, aspects of the present disclosure are not limited thereto. Additional aspects will be set forth in part in the description which follows, and will be apparent from the description to those of ordinary skill in the art to which the present disclosure pertains.

To solve the technical problem, an embodiment of the present disclosure provides a probe member including at least one contact portion having a pointed tip on one end and configured to be brought into contact with a terminal of a test-target object; a first body portion having a polygonal or circular pillar shape, the other end of the contact portion being coupled to one end of the first body portion; and a second body portion having a polygonal or circular pillar shape, the other end of the first body portion being coupled to one end of the second body portion, wherein the contact portion includes a material having higher hardness than the first and second body portions, and the first and second body portions include a material having electrical conductivity equal to or greater than 50% IACS (international annealed copper standard), wherein the probe member is used in a test socket in a state in which the probe member is at least partially inserted in a pipe having an internal space.

In an embodiment of the present disclosure, the contact portion may include nickel or a nickel alloy.

In an embodiment of the present disclosure, the first body portion or the second body portion may include a material containing at least one element selected from the group consisting of copper (Cu), gold (Au), silver (Ag), carbon (C), palladium (Pd), ruthenium (Ru), tungsten (W), aluminum (Al), tin (Sn), and rhodium (Rh).

In an embodiment of the present disclosure, the nickel alloy may include, in addition to nickel (Ni), at least one alloying element selected from the group consisting of carbon (C), boron (B), tungsten (W), manganese (Mn), titanium (Ti), palladium (Pd), oxygen (O), cobalt (Co), silver (Ag), indium (In), gallium (Ga), and a rare earth element.

In an embodiment of the present disclosure, the nickel alloy may include 0.1 to 50 parts by weight of the at least one alloying element based on 100 parts by weight of the nickel alloy.

In an embodiment of the present disclosure, the contact portion may have a hardness of 700 Hv (Vicker's hardness) or greater, and the first and second body portions may have a hardness of 50 Hv to 700 Hv.

In an embodiment of the present disclosure, the first and second body portions may be alternately stacked.

In an embodiment of the present disclosure, the contact portion may have a quadrangular pyramid shape, and lateral surfaces of the quadrangular pyramid shape may have an equilateral triangle shape with an apex angle of 50° to 90°.

In an embodiment of the present disclosure, the contact portion may have a height of 650 µm or less.

In an embodiment of the present disclosure, two or more contact portions may be provided, and a distance between adjacent contact portions may be 15 µm or greater.

To solve the technical problem, an embodiment of the present disclosure provides a method of manufacturing a probe member for a pogo pin used in a test socket, the probe member being configured to be at least partially inserted in a pipe having an internal space, the method including: forming at least one hole having a pointed tip on one end in a sacrificial substrate; forming a contact portion by filling a first stack material in the first hole and leveling the first stack material; placing a first dry film on an upper surface of the sacrificial substrate and forming a second hole having a polygonal or circular pillar shape in the first dry film to expose the contact portion; forming a first body portion by filling a second stack material in the second hole and leveling the second stack material; placing a second dry film on an upper surface of the first dry film and forming a third hole having a polygonal or circular pillar shape in the second dry film to expose the first body portion; and forming a second body portion by filling a third stack material in the third hole and leveling the third stack material, wherein the first stack material has higher hardness than the second and third stack materials, and the second and third stack materials have electrical conductivity equal to or greater than 50% IACS (international annealed copper standard).

In an embodiment of the present disclosure, the first stack material may include nickel or a nickel alloy.

In an embodiment of the present disclosure, the second body portion or the third body portion may include a material containing at least one element selected from the group consisting of copper (Cu), gold (Au), silver (Ag), carbon (C), palladium (Pd), ruthenium (Ru), tungsten (W), aluminum (Al), tin (Sn), and rhodium (Rh).

In an embodiment of the present disclosure, the nickel alloy may include, in addition to nickel (Ni), at least one alloying element selected from the group consisting of carbon (C), boron (B), tungsten (W), manganese (Mn), titanium (Ti), palladium (Pd), oxygen (O), cobalt (Co), silver (Ag), indium (In), gallium (Ga), and a rare earth element.

In an embodiment of the present disclosure, the nickel alloy medium injection unit 0.1 to 50 parts by weight of the at least one alloying element based on 100 parts by weight of the nickel alloy.

In an embodiment of the present disclosure, the first stack material may have a hardness of 700 Hv (Vickers hardness) or greater, and the second stack material and the third stack material may have a hardness of 50 Hv to 700 Hv.

To solve the technical problem, an embodiment of the present disclosure provides a pogo pin configured to be brought into contact with a terminal of a semiconductor device for inspecting electrical characteristics of the semiconductor device, the pogo pin including: the probe member; a pipe in which an internal space is formed to receive a portion of the probe member; a plunger having a portion inserted in the internal space and the other portion protruding outward from the pipe; and an elastic member having one end coupled to the probe member to bias the probe member toward an outside of the pipe, and the other end coupled to the plunger.

According to the embodiments of the present disclosure, the contact portion and the body portions of the probe member for a pogo pin may be vertically stacked based on a contact region with a terminal, the contact portion may include a high-hardness material, and the body portions may include a highly conductive material, thereby increasing the efficiency and lifespan of the probe member.

Effects of the present disclosure are not limited to the above-described effects but include all effects that may be inferred from the detailed description of the present disclosure or the constitution of the present disclosure defined by the claims.

DETAILED DESCRIPTION OF THE PREFERRED EMBODIMENTS

Figure 1:
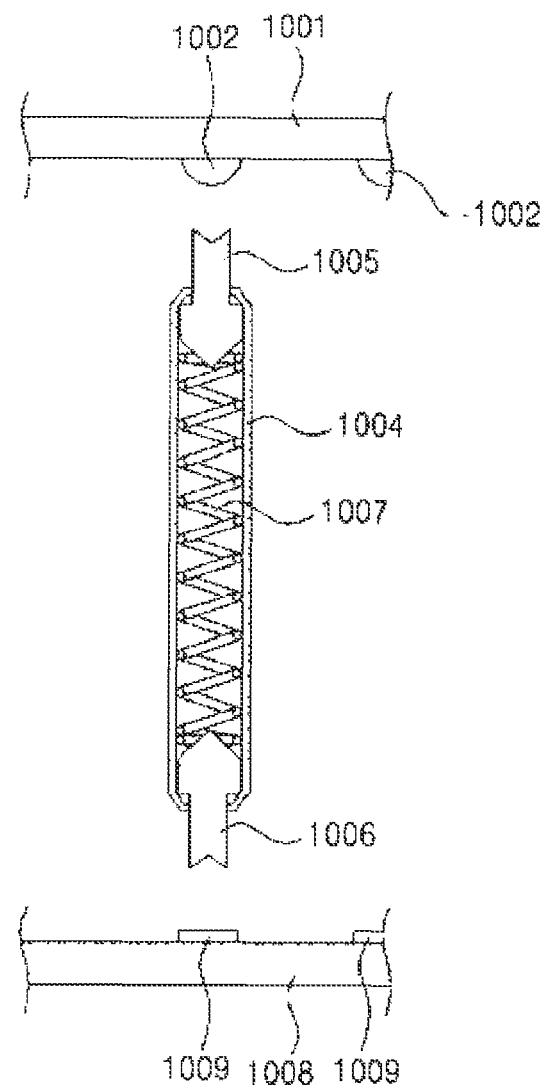
FIG. 1 is a schematic view illustrating a pogo pin of the related art.

The present disclosure will now be described with reference to the accompanying drawings. However, the present disclosure may be variously implemented. Thus, the present disclosure should not be considered as being limited to embodiments described below. In the drawings, parts not relevant to the present disclosure may be omitted for clarity of illustration, and like reference numerals refer to like elements throughout.

In the present specification, when a portion is referred to as being "connected to (jointed to, brought into contact with, or coupled to)" another portion, it may be directly connected to the other portion or intervening portions may be present.

In addition, it will be further understood that the terms "comprises" and/or "comprising" used herein specify the presence of stated elements, but do not preclude the presence or addition of one or more other elements unless the context clearly indicates otherwise.

In the following description, technical terms are used only for explaining specific embodiments while not limiting the scope and spirit of the present disclosure. As used herein, the singular forms "a," "an" and "the" are intended to include the plural forms as well, unless the context clearly indicates otherwise. The meaning of 'include' or 'comprise' specifies a property, a fixed number, a step, a process, an element, a component, or a combination thereof but does not exclude other properties, fixed numbers, steps, processes, elements, components, or combinations thereof.

Hereinafter, embodiments of the present disclosure will be described with reference to the accompanying drawings.

Figure 4:
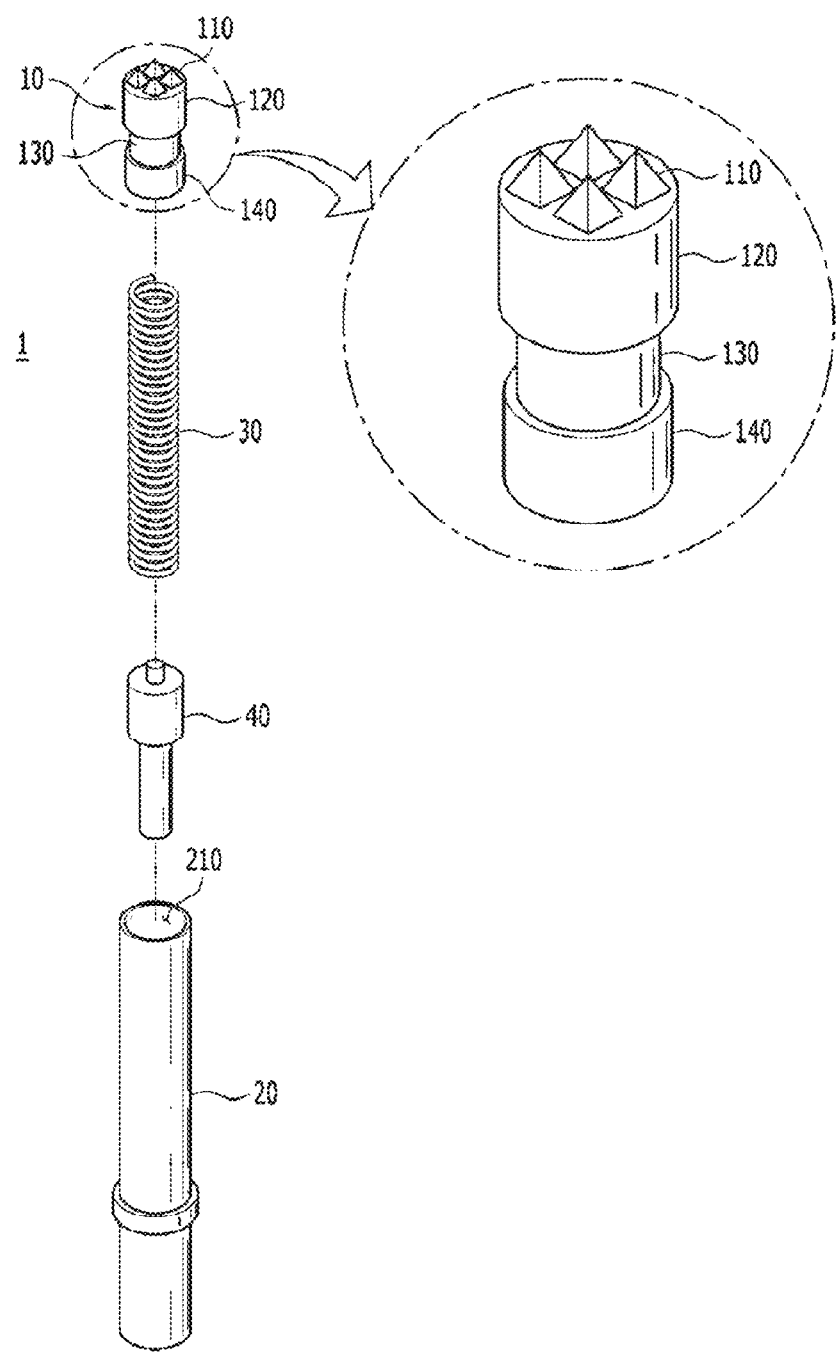
FIG. 4 is an exploded perspective view illustrating a pogo pin including a probe member according to a first embodiment of the present disclosure.
Figure 5:
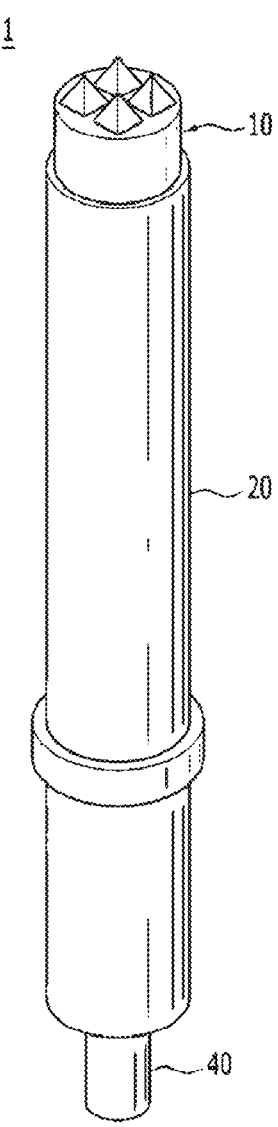
FIG. 5 is a perspective view illustrating the pogo pin including the probe member according to the first embodiment of the present disclosure.

FIG. 4 is an exploded perspective view illustrating a pogo pin 1 including a probe member 10 for a pogo pin according to a first embodiment, and FIG. 5 is a perspective view illustrating the pogo pin 1 including the probe member 10 for a pogo pin according to the first embodiment.

The pogo pin 1 is an element provided to a test socket (not shown) to connect a semiconductor device B (refer to FIG. 10) to a test device (not shown). The pogo pin 1 may include a pipe 20 (to be described later) of to be coupled to the test socket.

The pogo pin 1 including the probe member 10 for a pogo pin (hereinafter referred to as the probe member 10) includes the pipe 20 having a polygonal or circular pillar shape in which an internal space 210 is longitudinally formed with openings communicating with the internal space 210 at one end and the other end to receive the probe member 10; the probe member 10 having at least a portion placed in the internal space 210 of the pipe 20 and another portion protruding outward through the opening at the one end; a plunger 40 having at least a portion placed in the internal space 210 of the pipe 20 and another portion protruding outward through the opening at the other end; and an elastic member 30 placed in the internal space 210 of the pipe 20 to bias the probe member 10 or the plunger 40 in an outward direction. Accordingly, the pipe 20 forms a basic outer shape of the probe member 10 and may be referred to as a barrel or housing. The internal space 210 may have a circular pillar shape.

The probe member 10 may be used to inspect electrical characteristics of the semiconductor device B. As described above, the at least a portion of the probe member 10 is inserted in the internal space 210 of the pipe 20, and the other portion of the probe member 10 protrudes outward through the opening at the one end such that the one end of the probe member 10 makes contact with a terminal (b) (refer to FIG. 10) of the semiconductor device B.

The probe member 10 includes a plurality of contact portions 110 having pointed tips on one ends and capable of making contact with the terminal (b) of the semiconductor device B; a first body portion 120 having a polygonal or circular pillar shape, one end of the first body portion 120 being coupled to the other ends of the plurality of contact portions 110; and a second body portion 130 having a polygonal or circular pillar shape, one end of the second body portion 130 being coupled to the other end of the first body portion 120. That is, the first body portion 120 and the second body portion 130 are sequentially stacked on the other ends of the contact portions 110 in a height direction. In other words, the contact portions 110, the first body portion 120, and the second body portion 130 are vertically stacked based on a region to be brought into contact with the terminal (b) of the semiconductor device B. The height direction refers to a direction going away from the other ends of the contact portions 110, and the vertical direction refers to a direction perpendicular to a surface of the semiconductor device B on which the terminal (b) is formed.

Figure 2:
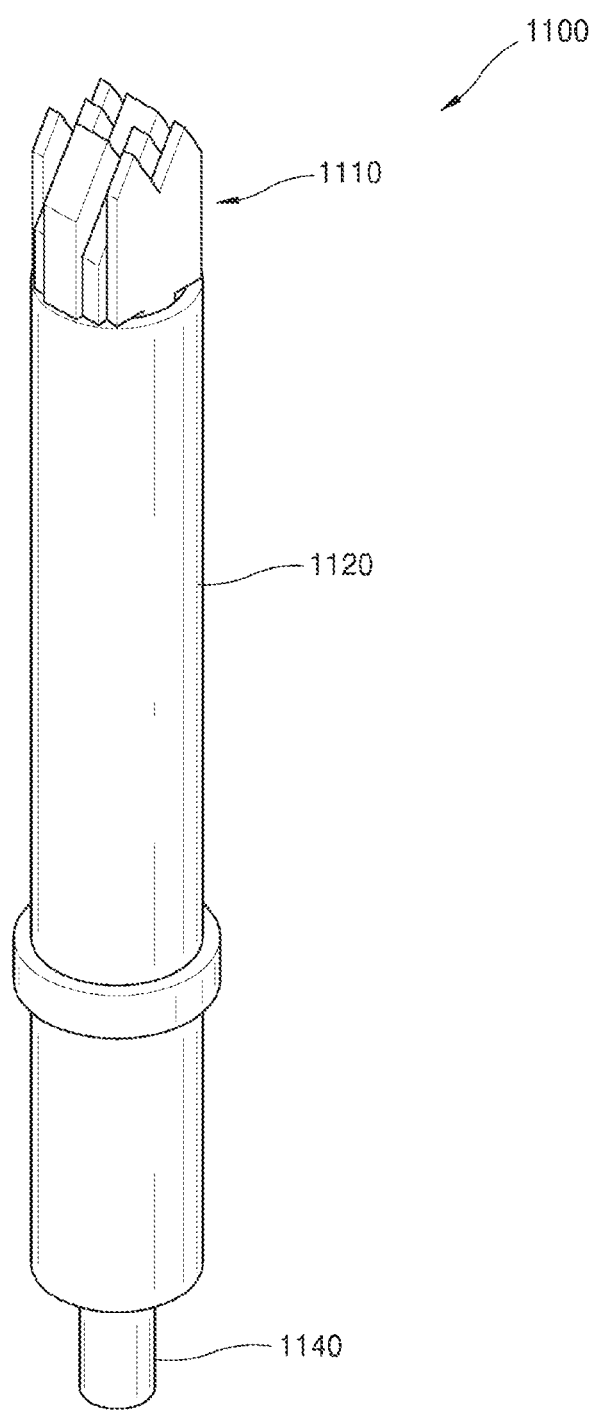
FIG. 2 is a perspective view illustrating another pogo pin of the related art.
Figure 3:
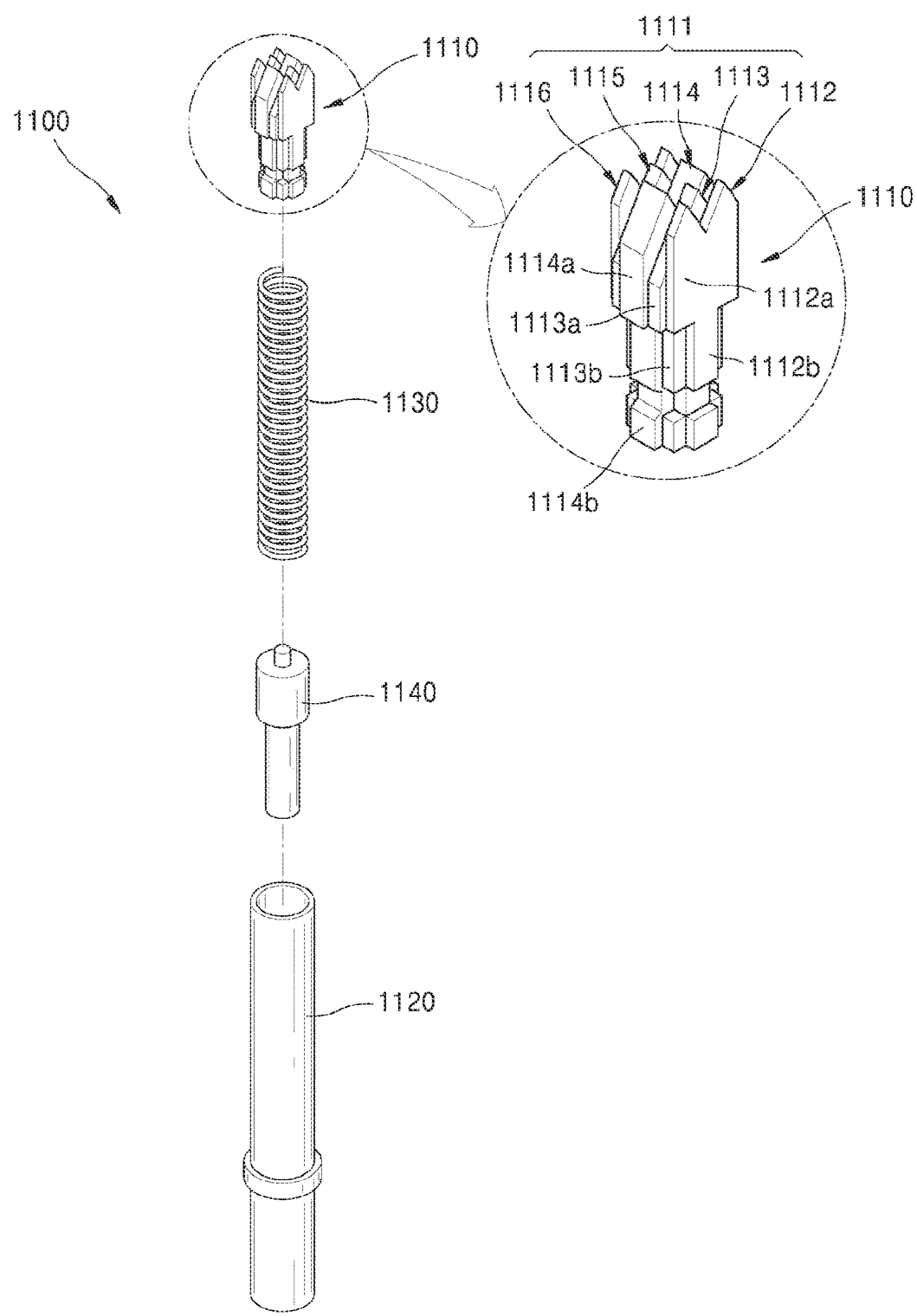
FIG. 3 is an exploded perspective view illustrating the pogo pin of the related art shown in FIG. 2.

Since the contact portions 110 and the body portions 120 and 130 are vertically stacked in the probe member 10 of the present disclosure, the probe member 10 may have improved structural stability and contact characteristics compared to the probe member 1110 of the related art having a plate shape as shown in FIG. 2.

In this case, the contact portions 110 may include a material having higher hardness than the first and second body portions 120 and 130, and thus may not be easily damaged by a concentrated load applied by the semiconductor device B. In an embodiment, the contact portions 110 may have a hardness of 700 Hv (Vickers hardness) or greater, and the first and second body portions 120 and 130 may have a hardness of 50 Hv to 700 Hv.

The contact portions 110 may include nickel or an nickel alloy, and the nickel alloy may include, in addition to nickel (Ni), at least one alloying element selected from the group consisting of carbon (C), boron (B), tungsten (W), manganese (Mn), titanium (Ti), palladium (Pd), oxygen (O), cobalt (Co), silver (Ag), indium (In), gallium (Ga), and a rare earth element. In this case, the nickel alloy may include 0.1 to 50 parts by weight of the at least one alloying element based on 100 parts by weight of the nickel alloy. The contact portions 110 including nickel or the nickel alloy may preferably have high corrosion resistance.

The nickel alloy including 0.1 to 50 parts by weight of the at least one alloying element based on 100 parts by weight of the nickel alloy may have higher strength and corrosion resistance than nickel. In addition, the first body portion 120 and the second body portion 130 may include a material having electrical conductivity equal to or greater than 50% IACS (international annealed copper standard), and in this case, current loss in the probe member 10 may be minimized. In more detail, the first body portion 120 or the second body portion 130 may include a material containing at least one element selected from the group consisting of copper (Cu), gold (Au), silver (Ag), carbon (C), palladium (Pd), ruthenium (Ru), tungsten (W), aluminum (Al), tin (Sn), and rhodium (Rh). The first body portion 120 and the second body portion 130 may include the same material or different materials.

The contact portions 110 may have a cross-sectional area gradually increasing in a direction from the one ends toward the other ends of the contact portions 110. FIGS. 4 and 5 illustrate the contact portions 110 having a quadrangular pyramid shape. The contact portions 110 having a quadrangular pyramid shape may make contact with the terminal (b) of the semiconductor device B at central apexes of the contact portions 110, and bottom surfaces of the contact portions 110 may be coupled to the one end of the first body portion 120.

In addition, at least one of two or more contact portions 110 may have a height different from the height of the other contact portions 110. For example, at least one contact portion 110 may include a material having higher hardness than the other contact portions 110 and may be higher than the other contact portions 110. When the at least one contact portion 110 having higher hardness makes contact with the terminal (b) of the semiconductor device B earlier than the other contact portions 110, the at least one contact portion 110 removes foreign substances from the terminal (b) or breaks an oxide layer formed on the surface of the terminal (b), and then the other contact portions 110 make contact with the terminal (b), thereby guaranteeing effective electrical conduction.

In addition, as described above, at least one of the contact portions 110 may include a material different from a material included in the other contact portions 110. For example, at least one contact portion 110 may have a high-hardness material including a nickel alloy, and the other contact portions 110 may have a metallic material having high conductivity such as gold or silver. At least one contact portion 110 containing a high-hardness material may have a function of breaking an oxide layer formed on the surface of the terminal (b), and the other contact portions 110 may provide high conductivity.

FIGS. 4 and 5 illustrate the probe member 10 in the case where the probe member 10 has four (2×2) contact portions 110. However, the probe member 10 may have nine (3×3) contact portions 110 or another number of contact portions 110 without limitations. In an embodiment of the present disclosure, the probe member 10 may further include a third body portion 140. The third body portion 140 has a polygonal or circular pillar shape, and the other end of the second body portion 130 is coupled to one end of the third body portion 140. The third body portion 140 may be stacked together with the first and second body portions 120 and 130 in the height direction based on the other ends of the contact portions 110.

In this case, the third body portion 140 located on a lowermost end of the probe member 10 may include the same material as a material included in the probe member 10 or a material included in the first body portion 120 or the second body portion 130.

FIGS. 4 and 5 illustrates that the first body portion 120 to the third body portion 140 have different outer diameters. However, this is a non-limiting example.

Figure 6:
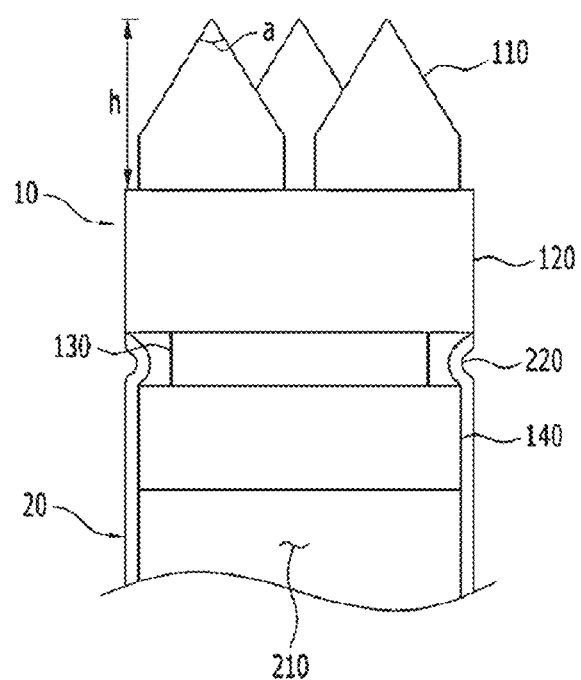
FIG. 6 is a cross-sectional view illustrating the probe member inserted into a pipe according to the first embodiment of the present disclosure.

FIG. 6 is a cross-sectional view illustrating the probe member 10 inserted in the pipe 20 according to the first embodiment of the present disclosure.

According to the embodiment of the present disclosure, regions of the contact portions 110 including the one ends of the contact portions 110 directly making contact with the terminal (b) of the semiconductor device B may have cross-sectional areas increasing in a direction from the one ends toward the other ends of the contact portions 110, and the other regions of the contact portions 110 including the other ends of the contact portions 110 directly in contact with the one end of the first body portion 120 may have a polygonal or circular pillar shape. In the contact portions 110 shown in FIG. 6, the regions including the one ends of the contact portions 110 directly making contact with the terminal (b) have a quadrangular pyramid shape, and the other regions of the contact portions 110 including the other ends contacting the one end of the first body portion 120 have a hexahedral shape.

The first body portion 120 may have a cross-sectional area greater than the cross-sectional area of the internal space 210. In this case, the probe member 10 may not be completely inserted into the pipe 20 because of the first body portion 120.

In addition, the second body portion 130 may have a cross-sectional area less than the cross-sectional areas of the first body portion 120, the second body portion 130, and the internal space 210. In this case, a region of the pipe 20 corresponding to the second body portion 130 may be pressed to form a recessed portion 220 and thus to fix the probe member 10 to the pipe 20 by the recessed portion 220.

In more detail, since the cross-sectional area of the internal space 210 in the region in which the recessed portion 220 is formed is less than the cross-sectional areas of the first body portion 120 and the third body portion 140, the recessed portion 220 is caught between the first body portion 120 and the third body portion 140, and thus a relative movement between the probe member 10 and the pipe 20 may be suppressed or limited.

In this case, the cross-sectional area of the third body portion 140 may be less than or equal to the cross-sectional area of the internal space 210 such that the third body portion 140 may be inserted into the internal space 210. If the cross-sectional area of the third body portion 140 is equal to the cross-sectional area of the internal space 210, the third body portion 140 may be fitted into the internal space 210.

That is, the probe member 10 and the pipe 20 may be primarily coupled to each other by fitting the third body portion 140, and may be secondarily coupled to each other by forming the recessed portion 220.

The contact portions 110 or the regions of the contact portions 110 having a quadrangular pyramid shape may have lateral surfaces having the shape of an equilateral triangle, and the apex angle (a) of the equilateral triangle may be within the range of 50° to 90°. If an apex angle (a) of the equilateral triangle is less than 50°, the contact portions 110 may be poorly durable and structurally unstable. Conversely, if the apex angle (a) of the equilateral triangle is greater than 90°, the contact portions 110 may make poor contact with the terminal (b).

In addition, the contact portions 110 may have a height (h) of 650 μm or less from the one ends to center portions of the other ends of the contact portions 110. If the height (h) of the contact portions 110 is greater than 650 μm, excessive current loss may occur in the contact portions 110.

Figure 7:
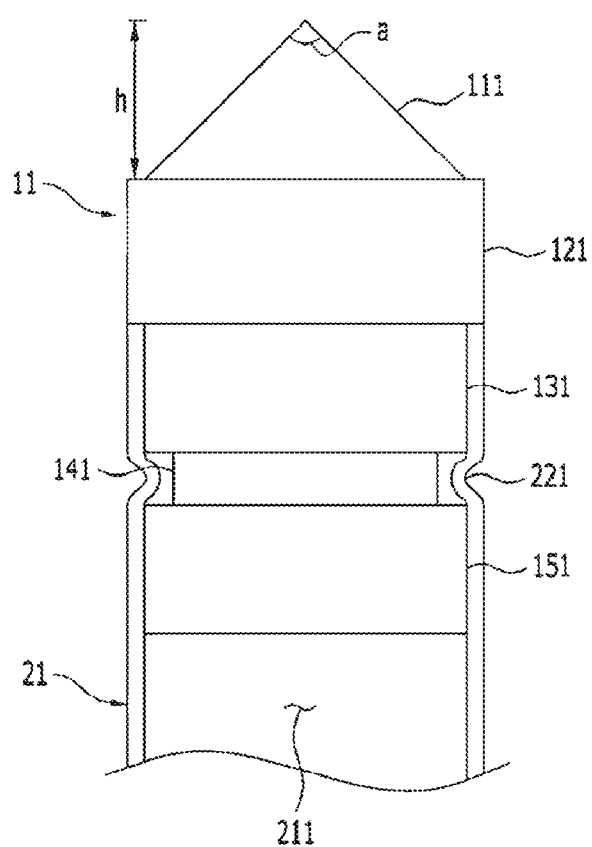
FIG. 7 is a cross-sectional view illustrating a probe member for a pogo pin according to a second embodiment of the present disclosure, the probe member being inserted into a pipe.

FIG. 7 is a cross-sectional view illustrating a probe member 11 inserted in a pipe 21 according to a second embodiment of the present disclosure.

he second embodiment may include technical features the same as in the first embodiment, and only features different from those of the first embodiment will now be mainly described.

Unlike the probe member 10 of the first embodiment, the probe member 11 of the second embodiment has one contact portion 111, and the contact portion 111 may have a cross-sectional area gradually increasing in a direction from one end toward the other end of the contact portion 111. In the present disclosure, the number of contact portions 111 may vary with user's designs.

According to the second embodiment of the present disclosure, the probe member 11 may further include a fourth body portion 151. The fourth body portion 151 may have a polygonal or circular pillar shape, and the other end of a third body portion 141 may be coupled to one end of the fourth body portion 151. The fourth body portion 151 may be stacked together with other body portions 121, 131, and 141 in a height direction based on the other end of the contact portion 111.

The third body portion 141 may have a cross-sectional area less than the cross-sectional areas of a second body portion 131, the fourth body portion 151, and an internal space 211. In this case, a region of the pipe 21 corresponding to the third body portion 141 may be pressed to form a recessed portion 221 and thus to fix the probe member 11 to the pipe 21 by the recessed portion 221. In more detail, since the cross-sectional area of the internal space 211 in the region in which the recessed portion 221 is formed is less than the cross-sectional areas of the second body portion 131 and the fourth body portion 151, the recessed portion 221 of the pipe 21 is caught between the second body portion 131 and the fourth body portion 151, and thus relative movement between the probe member 11 and the pipe 21 may be suppressed or limited. In this case, the cross-sectional area of the fourth body portion 151 may be less than or equal to the cross-sectional area of the internal space 211 such that the fourth body portion 151 may be inserted into the internal space 211. In an embodiment of the present disclosure, the cross-sectional area of the second body portion 131 may also be less than or equal to the cross-sectional area of the internal space 211 such that the second body portion 131 may be inserted into the pipe 21.

In addition, if the cross-sectional area of the second body portion 131 or the fourth body portion 151 is equal to the cross-sectional area of the internal space 211, the second body portion 131 or the fourth body portion 151 may be fitted into the internal space 210. That is, the probe member 11 and the pipe 21 may be primarily coupled to each other by fitting the second body portion 131 or the fourth body portion 151, and may be secondarily coupled to each other by forming the recessed portion 221.

The probe member 11 may further include an addition body portion in addition to the first to fourth body portions 121 to 151. The additional body portion may also be sequentially stacked together with the first to fifth body portions 121 to 151 in the height direction based on the other end of the contact portion 110. In this case, the additional body portion located on the lowermost end may include the same material as a material included in the contact portion 110 or a material included in the other body portions 121 to 141.

As described above, the body portions of the probe members 10 and 11 may have different cross-sectional areas to easily form a multi-step structure, and thus, the probe members 10 and 11 may be easily coupled to the pipes 20 and 21, respectively.

In addition, the body portions of the probe members 10 and 110 to be inserted into the pipes 20 and 21, respectively, may have a circular pillar shape, and may thus be easily inserted into the pipes 20 and 21, respectively, having a circular pillar shape.

Figure 8:
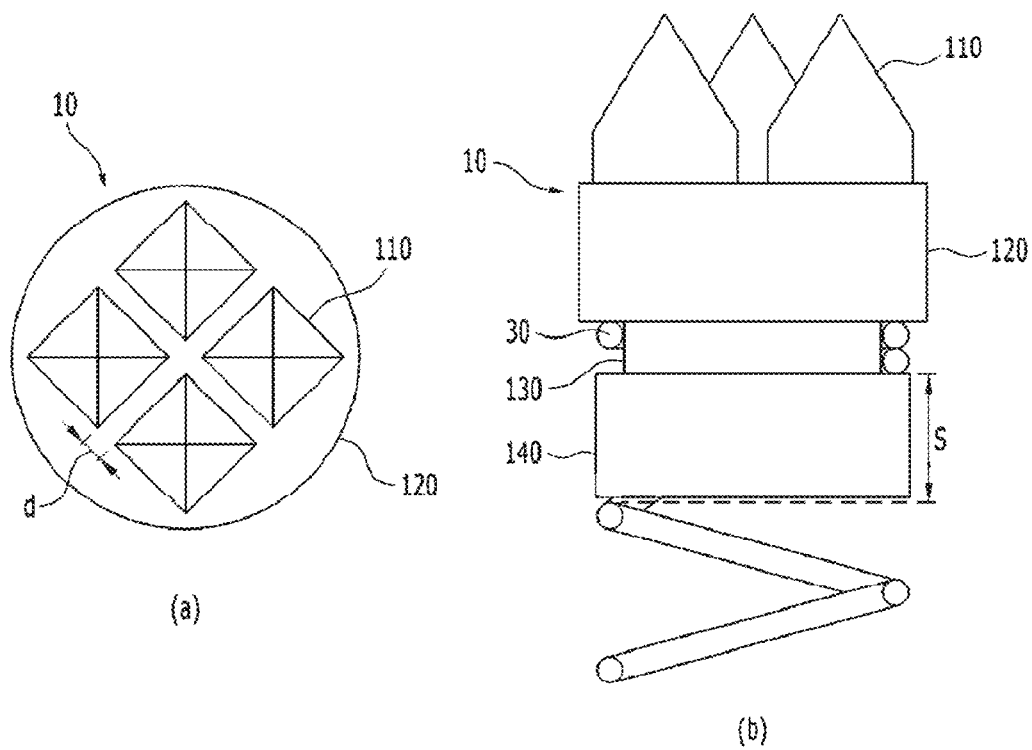
FIG. 8 illustrates a front view and a cross-sectional view of the probe member for a pogo pin of the first embodiment of the present disclosure, the probe member being connected to an elastic member.

FIG. 8 illustrates a front view and a cross-sectional view of the probe member 10 coupled to the elastic member 30 according to the first embodiment of the present disclosure. FIG. 8(a) illustrates the front view of the probe member 10.

In the probe member 10 of the first embodiment of the present disclosure, the four contact portions 110 are coupled to the one end of the first body portion 120 in such a manner that the four contact portions 110 are spaced apart from each other. In this case, the distance (d) between adjacent contact portions 110 may be 15 μm or greater. If the distance (d) between adjacent contact portions 110 is less than 15 μm, the adjacent contact portions 110 may interfere with each other.

FIG. 8(b) illustrates the cross-sectional view of the probe member 10. The elastic member 30 is provided to resist against compressing force. That is, the elastic member 30 includes a plurality of circular turns connected to each other, and in a load-free state, the circular turns connected to each other has a gap (s) therebetween.

The second body portion 130 may have a cross-sectional area less than or equal to an inner circumferential cross-sectional area of the elastic member 30 and may thus be inserted into the elastic member 30, and the first body portion 120 may have a cross-sectional area greater than the inner circumferential cross-sectional area of the elastic member 30 such that one end of the elastic member 30 may be supported by the first body portion 120. In addition, the third body portion 140 may have a cross-sectional area greater than the inner circumferential cross-sectional area of the elastic member 30 such that the third body portion 140 may be inserted between a gap (s) between a circular turn and the next circular turn connected to the circular turn. Owing to this, the probe member 10 and the elastic member 30 may be coupled to each other without using an additional coupling member. In this case, the thickness of the third body portion 140 may be less than or equal to the gap (s) between the circular turn and the next circular turn connected to the circular turn.

Figure 9:
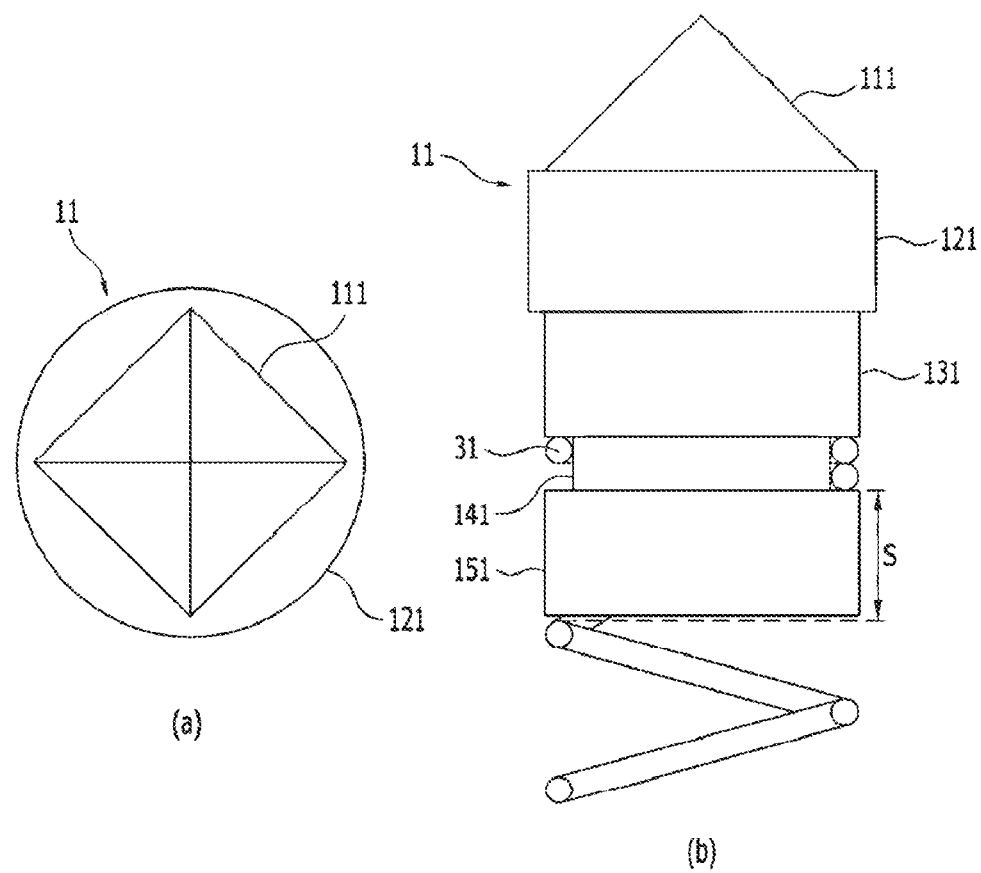
FIG. 9 illustrates a front view and a cross-sectional view of the probe member for a pogo pin of the second embodiment of the present disclosure, the probe member being connected to an elastic member.

FIG. 9 illustrates a front view and a cross-sectional view of the probe member 11 coupled to an elastic member 31 according to the second embodiment of the present disclosure. FIG. 9(a) illustrates the front view of the probe member 11.

In the probe member 11 of the second embodiment of the present disclosure, one contact portion 111 is coupled to the one end of the first body portion 121. In this case, the contact portion 111 may have a cross-sectional area less than the cross-sectional area of the first body portion 121 such that the contact portion 111 may be completely supported by the first body portion 121.

FIG. 9(b) illustrates the cross-sectional view of the probe member 11. The third body portion 141 may have a cross-sectional area less than or equal to an inner circumferential cross-sectional area of the elastic member 31 and may thus be inserted into the elastic member 31, and the second body portion 131 may have a cross-sectional area greater than the inner circumferential cross-sectional area of the elastic member 31 such that one end of the elastic member 31 may be supported by the second body portion 131. In addition, the fourth body portion 151 may have a cross-sectional area greater than the inner circumferential cross-sectional area of the elastic member 31 such that the fourth body portion 151 may be inserted between a gap (s) between a circular turn and the next circular turn connected to the circular turn. Owing to this, the probe member 11 and the elastic member 31 may be coupled to each other without using an additional coupling member. In this case, the thickness of the fourth body portion 151 may be less than or equal to the gap (s) between the circular turn and the next circular turn connected to the circular turn.

As described above, in the probe members 10 and 11, the body portions may have different cross-sectional areas to easily form a multi-step structure, and thus the probe members 10 and 11 may be easily coupled to the elastic members 30 and 31.

Figure 10:
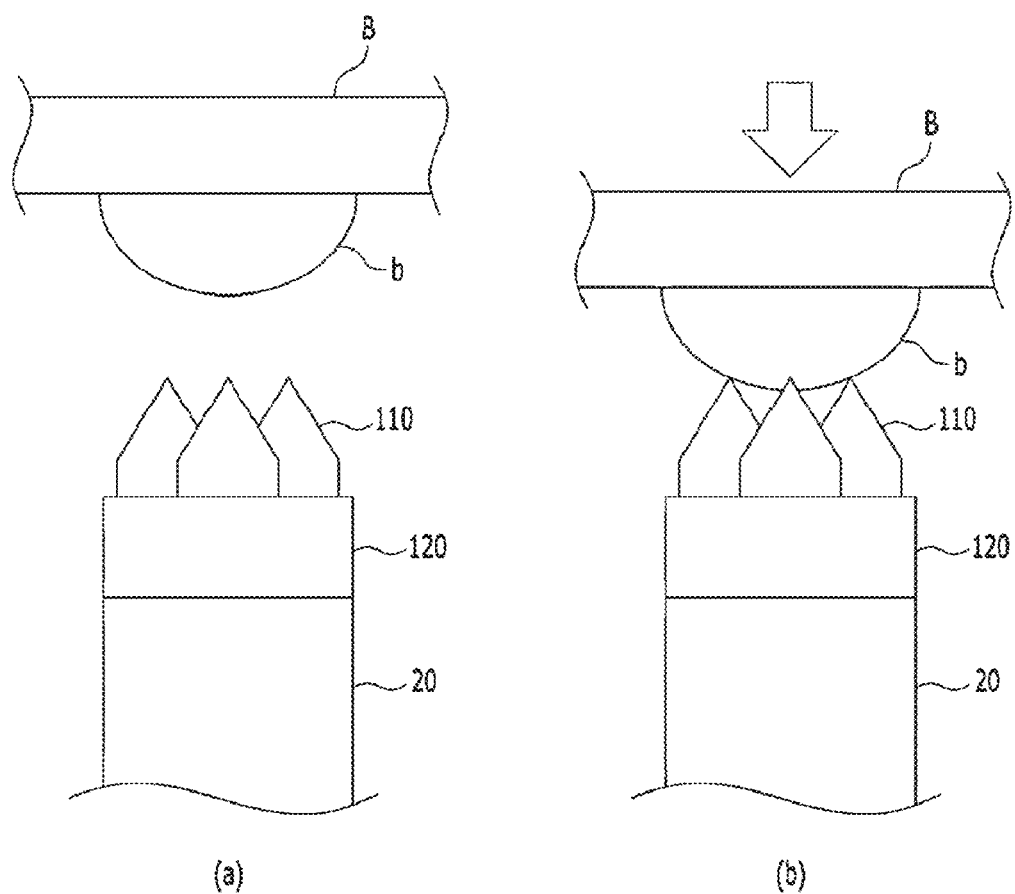
FIG. 10 illustrates operational views of the pogo pin including the probe member according to the first embodiment of the present disclosure.

FIG. 10 illustrates operational views of the pogo pin 1 including the probe member 10 according to the first embodiment of the present disclosure.

First, referring to FIG. 10(a), the terminal (b) of the semiconductor device B is placed at a position corresponding to the pogo pin 1. Referring to FIG. 10(b), the semiconductor device B is lowered or the pogo pin 1 is lifted to bring the terminal (b) of the semiconductor device B into contact with the contact portions 110 of the probe member 10.

According to the present disclosure, the shapes, positions, and heights of the plurality of contact portions 110 of the probe member 10 can be freely selected according to the purpose of a designer, and thus an optimal contact type suitable for the terminal (b) of the semiconductor device B may be provided.

Figure 11:
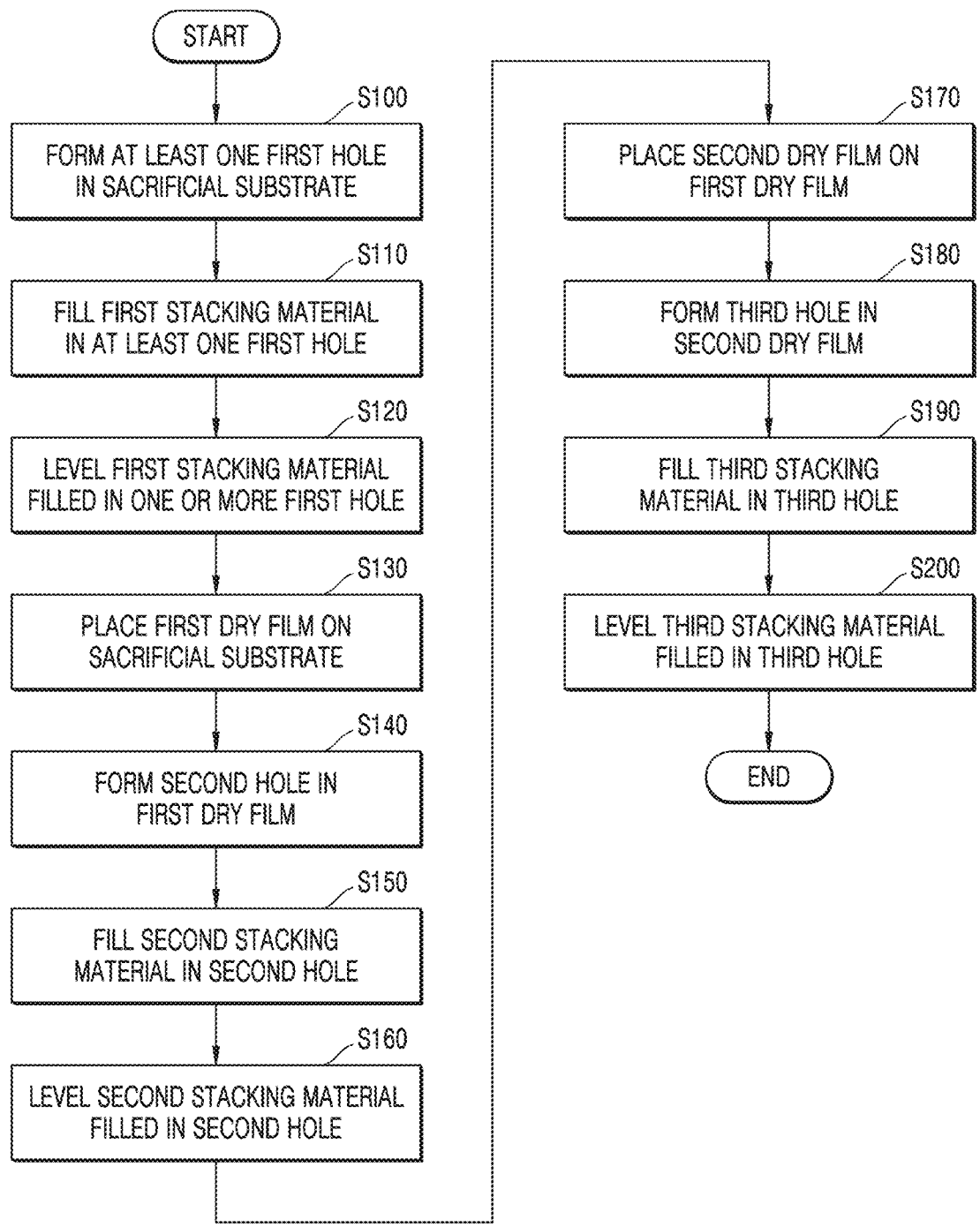
FIG. 11 is a flowchart illustrating a method of manufacturing a probe member for a pogo pin according to an embodiment of the present disclosure.

FIG. 11 is a flowchart illustrating a method of manufacturing a probe member according to an embodiment of the present disclosure.

According to the embodiment of the present disclosure, the method of manufacturing a probe member includes: a process S100 of forming at least one hole in a sacrificial substrate; a process S110 of filling a first stack material in the first hole; a process S120 of leveling the first stack material filled in the first hole; a process S130 of placing a first dry film on the sacrificial substrate; a process S140 of forming a second hole in the first dry film to expose the first stack material; a process S150 of filling a second stack material in the second hole; a process S160 of leveling the second stack material filled in the second hole; a process S170 of placing a second dry film on the first dry film; a process S180 of forming a third hole in the second dry film to expose at least a portion of the second stack material; a process S190 of filling a third stack material in the third hole; and a process S200 of leveling the third stack material filling in the third hole. Through these processes, a probe member including a contact portion, a first body portion, and a second body portion may be manufactured. Thereafter, the manufacture of the probe member may be completed by removing all the dry films and separating the probe member from the sacrificial substrate. Like this, the probe member of the present disclosure may be manufactured through micro electro mechanical system (MEMS) processes.

The process S100 of forming the at least one hole in the sacrificial substrate to the process S120 of leveling the first stack material filled in the first hole may be for forming the contact portion of the probe member, the process S130 of placing the first dry film on the upper surface of the sacrificial substrate to the process S160 of leveling the second stack material filled in the second hole may be for forming the first body portion of the probe member, the process S170 of placing the second dry film on the first dry film to the process S200 of leveling the third stack material filling in the third hole may be for forming the second body portion.

The first stack material may include nickel or an nickel alloy, and the nickel alloy may include, in addition to nickel (Ni), at least one alloying element selected from the group consisting of carbon (C), boron (B), tungsten (W), manganese (Mn), titanium (Ti), palladium (Pd), oxygen (O), cobalt (Co), silver (Ag), indium (In), gallium (Ga), and a rare earth element. In this case, the nickel alloy may include 0.1 to 50 parts by weight of the at least one alloying element based on 100 parts by weight of the nickel alloy.

In addition, the second stack material and the third stack material may include a material having electrical conductivity equal to or greater than 50% IACS, and in this case, current loss in the probe member 10 may be minimized. In more detail, the second stack material and the third stack material may include a material containing at least one element selected from the group consisting of copper (Cu), gold (Au), silver (Ag), carbon (C), palladium (Pd), ruthenium (Ru), tungsten (W), aluminum (Al), tin (Sn), and rhodium (Rh). The second stack material and the third stack material may include the same material or different materials.

In an embodiment of the present disclosure, an additional body portion may be formed through processes of placing a dry film, forming a hole, filling a stack material in the hole, and leveling the stack material as described above. That is, the number of sequentially stacked body portions may vary with user's designs. In this case, a body portion located on the uppermost end may include the same material as a material included in the contact portion or a material included in the first body portion and the second body portion.

According to an embodiment of the present disclosure, prior to the process S110 of filling the first stack material in the first hole, the method may further include a process of forming a conductive layer on the upper surface of the sacrificial substrate in which the first hole is formed. In this case, the conductive layer may increase the electrical conductivity of the probe member.

According to an embodiment of the present disclosure, prior to the process S130 of placing the first dry film on the sacrificial substrate, the method may further include a process of forming a conductive layer on the upper surface of the sacrificial substrate. In the case, the conductive layer may increase the electrical conductivity of the probe member.

In addition, according to the characteristics of the first dry film (a negative or positive film), the process S140 of forming the second hole may be performed by exposing, to light, a region in which the second hole will be formed or a region in which the second hole will not be formed. In this case, the second hole has the same shape as the first body portion to be formed.

According to an embodiment of the present disclosure, prior to the process S170 of placing the second dry film on the first dry film, the method may further include a process of forming a conductive layer on the upper surface of the first dry film. In the case, the conductive layer may increase the electrical conductivity of the probe member.

In addition, according to the characteristics of the second dry film (a negative or positive film), the process S140 of forming the third hole may be performed by exposing, to light, a region in which the third hole will be formed or a region in which the third hole will not be formed. In this case, the third hole has the same shape as the second body portion to be formed.

In this case, the first stack material has higher hardness than the second and third stack materials. Thus, the contact portion may not be easily damaged by a concentrative load applied by the semiconductor device B. In more detail, the first stack material have a hardness of 700 Hv (Vickers hardness) or greater, and the second and third stack materials may have a hardness of 50 Hv to 700 Hv.

The probe member may be manufactured through MEMS processes to have a multi-step structure, and owing to the multi-step structure, the probe member may easily be coupled to a pipe or an elastic member.

Figure 12:
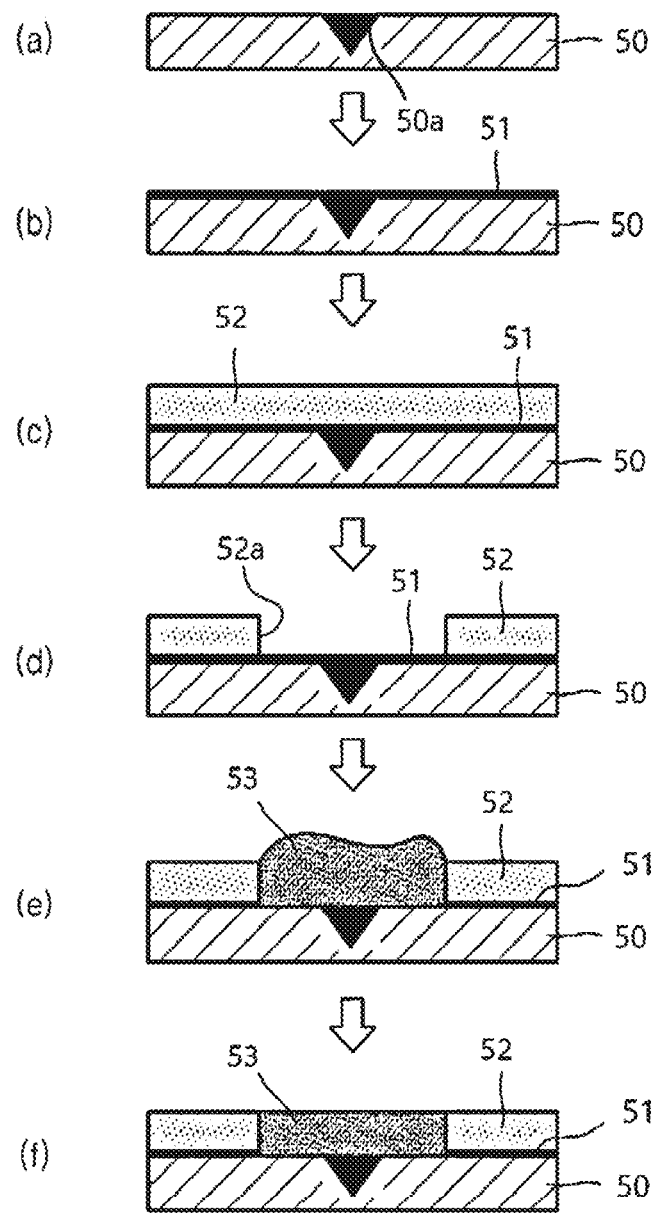
FIG. 12 is a view illustrating processes S130 to S160 shown in FIG. 11.

FIG. 12 is a view illustrating the processes S130 to S160 shown in FIG. 11.

Referring to FIG. 12(*a*), in the process S130, a sacrificial substrate 50 having a first hole filled with a first stack material is prepared. Referring to FIG. 12(*b*), a conductive layer 51 is formed on an upper surface of the sacrificial substrate 50. Then, referring to FIG. 12(*c*), a first dry film 52 is placed on the conductive layer 51.

Referring to FIG. 12(d), in the process S140, the first dry film 52 is exposed to light to form a hole 52a in an upper surface of the of the first dry film 52.

Referring to FIG. 12(e), in the process S150, a second stack material 53 is filled in the second hole 52a formed in the upper surface of the first dry film 52. Referring to FIG. 12(f), in the process S160, the second stack material 53 is leveled with a chemical or physical leveling device to form a first body portion. A second body portion and a third body portion are formed in the same manner as that shown in FIG. 11.

Figure 13:
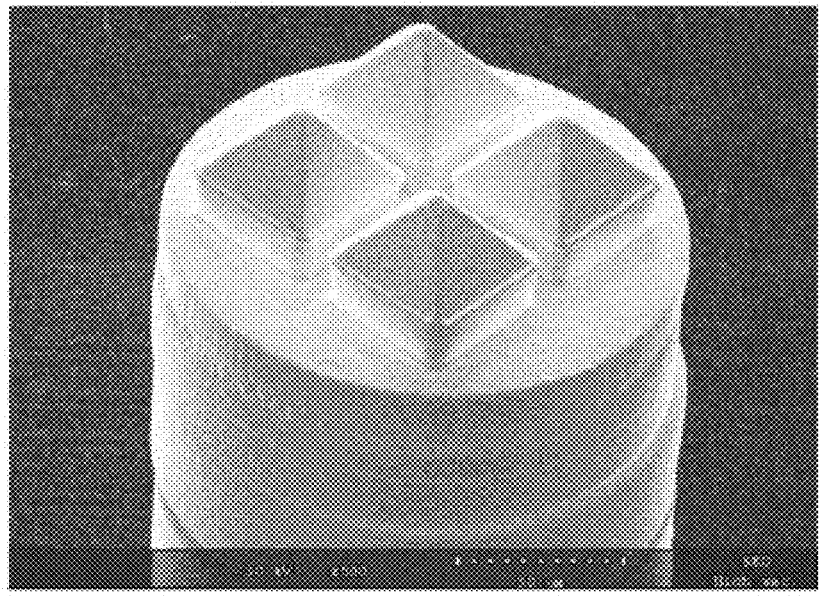
FIG. 13 is a scanning electron microscope (SEM) image showing a portion of the probe member for a pogo pin according to the first embodiment of the present disclosure.

FIG. 13 is a scanning electron microscope (SEM) image showing a portion of a probe member of the first embodiment of the present disclosure. Referring to the image, a plurality of contact portions having a quadrangular pyramid shape are formed in one-end regions, and body portions supporting the contact portions are stacked on the other ends of the contact portions.

Figure 14:
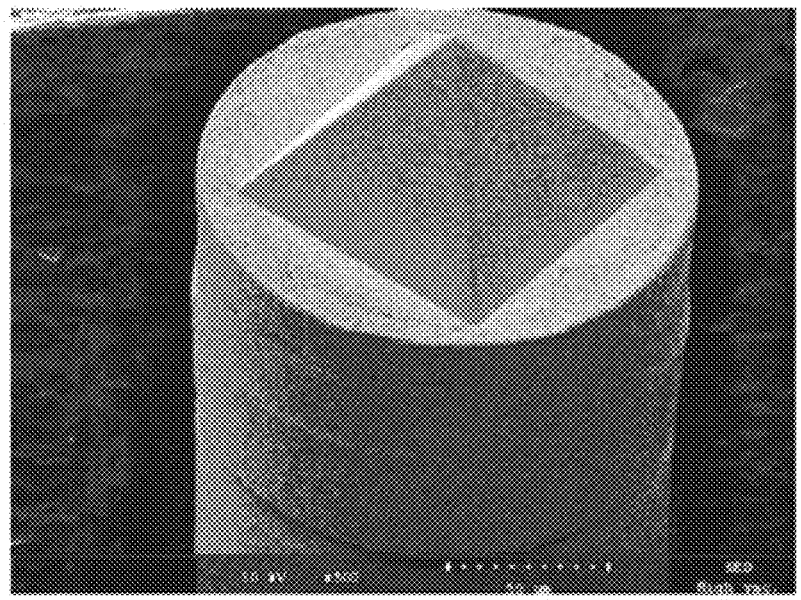
FIG. 14 is an SEM image showing a portion of the probe member for a pogo pin according to the second embodiment of the present disclosure.

FIG. 14 is an SEM image showing a portion of a probe member of the second embodiment of the present disclosure. Referring to FIG. 14, a contact portion having a quadrangular pyramid shape is formed, and body portions supporting the contact portion are stacked on the other end of the contact portion.

According to a probe member according to the present disclosure, a contact portion and a body portion provided on the other end of the contact portion may include different materials. In this case, the contact portion may include a high-hardness material having high wear resistance and thus may not easily wear even after being used many times.

Therefore, the probe member may be reliably brought into contact with a terminal even after being used many times. In addition, the body portion may include a highly conductive material to minimize current loss in the probe member. That is, since the contact portion and the body portion of the probe member includes different materials according to the present disclosure, the efficiency and lifespan of the probe member may be improved.

The description of the present disclosure is for illustrative purposes only, and it will be understood by those of ordinary skill in the art that modifications and changes in form may be made without departing from the technical ideas and essential features of the present disclosure. Therefore, the above-described embodiments should be considered in a descriptive sense only and not for purposes of limitation. For example, each element described above may be provided in a distributed manner, and elements described above as being distributed may be provided in a combined form.

The scope of the present disclosure is defined by the following claims, and it should be construed that all modifications or changes made within the meaning and scope of the present disclosure and equivalents thereof are within the scope of the present disclosure.

The invention claimed is:

1. A probe member for a pogo pin used in a test socket, the probe member having an axial length and a width extending transverse thereto and being configured to be at least partially inserted in a pipe having an internal space, the probe member comprising:
   at least two contact portions each having a pointed tip on one end and configured to be brought into contact with a terminal of a test-target object;
   a first body portion having a polygonal or circular pillar shape, the other end of each of the at least two contact portions being coupled to one end of the first body portion; and
   a second body portion having a polygonal or circular pillar shape, the other end of the first body portion being coupled to one end of the second body portion,
   wherein the at least two contact portions comprise a material having higher hardness than the first and second body portions, the material of the at least two contact portions being disposed across the entirety of the respective widths thereof, and each of the first and second body portions comprises a material having electrical conductivity equal to or greater than 50% IACS (International Annealed Copper Standard), the material of each of the first and second body portions being disposed across the entirety of the respective widths thereof,
   wherein the at least two contact portions are spaced apart from each other.

2. The probe member of claim 1, wherein the at least two contact portions comprise nickel or a nickel alloy.

3. The probe member of claim 1, wherein the first body portion or the second body portion comprises a material containing at least one element selected from the group consisting of copper (Cu), gold (Au), silver (Ag), carbon (C), palladium (Pd), ruthenium (Ru), tungsten (W), aluminum (Al), tin (Sn), and rhodium (Rh).

4. The probe member of claim 2, wherein the at least two contact portions comprise nickel alloy, and the nickel alloy comprises nickel (Ni) and at least one alloying element selected from the group consisting of carbon (C), boron (B), tungsten (W), manganese (Mn), titanium (Ti), palladium (Pd), oxygen (O), cobalt (Co), silver (Ag), indium (In), gallium (Ga), and a rare earth element.

5. The probe member of claim 4, wherein the at least two contact portions comprise nickel alloy, and the nickel alloy comprises 0.1 to 50 parts by weight of the at least one alloying element based on 100 parts by weight of the nickel alloy.

6. The probe member of claim 1, wherein the at least two contact portions have a hardness of about 700 Hv (Vickers hardness) or greater, and each of the first and second body portions has a hardness of about 50 Hv to about 700 Hv.

7. The probe member of claim 1, wherein the first and second body portions are alternately stacked.

8. The probe member of claim 1, wherein the at least two contact portions each have a quadrangular pyramid shape and lateral surfaces of the quadrangular pyramid shape have an equilateral triangle shape with an apex angle of 50° to 90°.

9. The probe member of claim 1, wherein the at least two contact portions each have a height of about 650 µm or less.

10. The probe member of claim 1, wherein a distance between adjacent contact portions of the at least two contact portions is about 15 µm or greater.

11. A pogo pin configured to be brought into contact with a terminal of a semiconductor device for inspecting electrical characteristics of the semiconductor device, the pogo pin comprising:
   the probe member of claim 1;
   a pipe including an internal space to receive a portion of the probe member;
   a plunger having a portion inserted in the internal space and another portion protruding outward from the pipe; and
   an elastic member having one end coupled to the probe member to bias the probe member toward an outside of the pipe, and the other end coupled to the plunger.

* * * * *